(12) United States Patent
Hong et al.

(10) Patent No.: US 9,653,164 B2
(45) Date of Patent: May 16, 2017

(54) METHOD FOR INTEGRATING NON-VOLATILE MEMORY CELLS WITH STATIC RANDOM ACCESS MEMORY CELLS AND LOGIC TRANSISTORS

(71) Applicant: FREESCALE SEMICONDUCTOR, INC., Austin, TX (US)

(72) Inventors: Cheong Min Hong, Austin, TX (US); Laureen H. Parker, Austin, TX (US)

(73) Assignee: NXP USA, INC., Austin, TX (US)

( * ) Notice: Subject to any disclaimer, the term of this patent is extended or adjusted under 35 U.S.C. 154(b) by 20 days.

(21) Appl. No.: 14/656,832

(22) Filed: Mar. 13, 2015

(65) Prior Publication Data

US 2016/0267979 A1 Sep. 15, 2016

(51) Int. Cl.

| G11C 14/00 | (2006.01) |
|---|---|
| H01L 29/51 | (2006.01) |
| H01L 21/265 | (2006.01) |
| H01L 21/28 | (2006.01) |
| H01L 29/423 | (2006.01) |
| H01L 27/11524 | (2017.01) |
| H01L 27/11534 | (2017.01) |

(52) U.S. Cl.
CPC .... *G11C 14/0063* (2013.01); *H01L 21/26513* (2013.01); *H01L 21/28273* (2013.01); *H01L 27/11524* (2013.01); *H01L 27/11534* (2013.01); *H01L 29/42332* (2013.01); *H01L 29/511* (2013.01); *H01L 29/518* (2013.01)

(58) Field of Classification Search
CPC .......... G11C 14/0063; H01L 29/42332; H01L 21/28273; H01L 27/11534; H01L 27/11524; H01L 29/511; H01L 21/26513; H01L 29/518
See application file for complete search history.

(56) References Cited

U.S. PATENT DOCUMENTS

| 5,917,218 A | 6/1999 | Choi et al. |
|---|---|---|
| 7,042,051 B2 | 5/2006 | Ootsuka et al. |
| 7,821,055 B2 * | 10/2010 | Loiko ................. B82Y 10/00 257/316 |

(Continued)

OTHER PUBLICATIONS

U.S. Appl. No. 14/470,374, Hong, Cheong M., Semiconductor Memory Cell and Driver Circuitry With Gate Oxide Formed Simultaneously, filed Aug. 27, 2014.

(Continued)

*Primary Examiner* — Jarrett Stark

(57) ABSTRACT

A method of making a semiconductor device is described. The method comprises depositing a first polysilicon layer in a non-volatile memory (NVM) region and a logic region of a substrate. A first coating layer is deposited over the first polysilicon layer. The first coating layer and the first polysilicon layer are patterned to form a first gate in the NVM region. A memory cell is formed including the first gate. The first coating layer and the first layer of polysilicon in the logic region are removed and a logic gate polysilicon layer is deposited. The logic gate polysilicon layer is patterned to form a second gate in the logic region while the logic gate polysilicon layer is removed from the NVM region. Source/drain regions of the memory cell and the second gate are implanted concurrently.

17 Claims, 13 Drawing Sheets

(56) References Cited

U.S. PATENT DOCUMENTS

| | | |
|---|---|---|
| 8,372,699 B2* | 2/2013 | Kang ............... H01L 21/28282 |
| | | 257/E21.21 |
| 8,400,828 B2 | 3/2013 | Torii et al. |
| 2006/0105522 A1 | 5/2006 | Steimle et al. |
| 2006/0118854 A1 | 6/2006 | Lee |
| 2006/0134864 A1 | 6/2006 | Higashitani et al. |
| 2009/0269893 A1 | 10/2009 | Hashimoto et al. |
| 2009/0273013 A1* | 11/2009 | Winstead ......... H01L 27/11526 |
| | | 257/315 |
| 2011/0204450 A1 | 8/2011 | Moriya |
| 2011/0309447 A1 | 12/2011 | Arghavani et al. |
| 2012/0034751 A1 | 2/2012 | Ariyoshi et al. |
| 2015/0072489 A1 | 3/2015 | Baker et al. |

OTHER PUBLICATIONS

U.S. Appl. No. 14/023,440, Baker, Frank Kelsey, Jr., Non-Volatile Memory (NVM) Cell and High-K and Metal Gate Transistor Integration, filed Sep. 10, 2013.

Restriction Requirement dated Dec. 18, 2015 received in U.S. Appl. No. 14/656,844.

Notice of Allowance dated Mar. 9, 2016 received in U.S. Appl. No. 14/656,844.

* cited by examiner

US 9,653,164 B2

METHOD FOR INTEGRATING NON-VOLATILE MEMORY CELLS WITH STATIC RANDOM ACCESS MEMORY CELLS AND LOGIC TRANSISTORS

BACKGROUND

Field

This disclosure relates generally to process integration, and more specifically, to a method for integrating non-volatile memory cells with static random access memory cells and logic transistors.

Related Art

Many semiconductor devices include, or embed, non-volatile memory (NVM) cells with other transistor types on the same integrated circuit (IC). The manufacturing processes for the different transistor types may not be the same, requiring that the processes be integrated. For example, to integrate NVM with, for example, CMOS (complementary metal oxide semiconductor), the CMOS process may be modified to include the process steps necessary to fabricate the NVM memory cell and the supporting devices.

Non-volatile memory is commonly embedded in, for example, system-on-a-chip (SoC) integrated circuits having CMOS logic circuitry. The NVM may include a floating gate comprising polysilicon, or use a charge storage layer comprising nanocrystals, silicon nitride, or silicon oxynitride layer. The non-volatile memory cell may be integrated with various types of CMOS transistors used in analog and digital circuitry, such as for example, logic, high voltage switching transistors, drivers, or static random access memory (SRAM) cells.

The integration for NVM cells with logic transistors can be a challenge due to the different requirements for the NVM cells, which store charge, and the logic transistors which are commonly intended for high speed operation. The need for a charge storage layer in the NVM cell makes integration of the NVM cells and the logic transistors difficult, especially when various types of logic transistors are required.

Integration of NVM with logic transistors introduces additional wet etches, anneals, oxidations, etc. which modify the logic well profiles and the boundary between active and trench regions (trench fill recess, active corner rounding, etc). As a result, the logic devices no longer match the electrical targets of the original baseline process. Many learning cycles are needed to adjust the implants, etc. to approximate the original logic behavior, and ultimately it is not possible to exactly match the original targets/models. Consequently, the logic transistor manufacturing process needs to be re-characterized to work in the NVM-integrated flow.

Therefore, a need exists for a process integration flow that solves the above problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
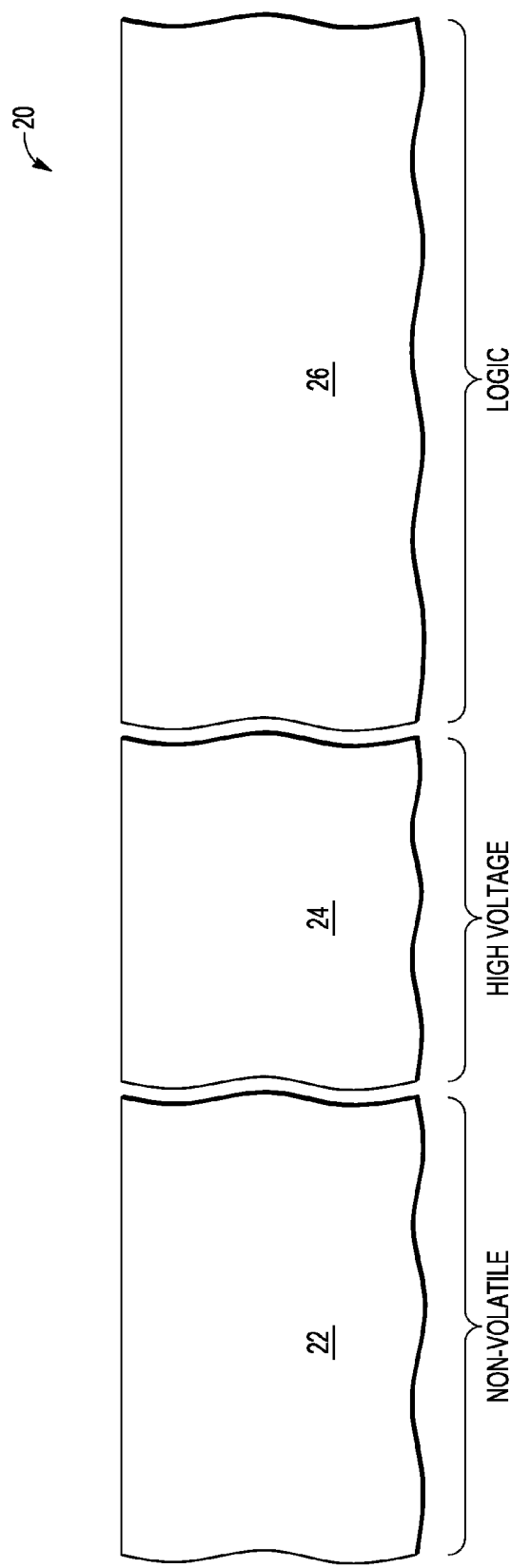
FIG. 1 through FIG. 13 illustrate a method for integrating a non-volatile memory cell with various logic transistors on a semiconductor device in accordance with an embodiment.

Generally, there is provided, a method for integrating non-volatile memory cells with logic transistors and static random access transistors on an integrated circuit. The logic transistors may be low voltage transistors, high voltage transistors, or dual gate oxide transistors. The method defines an NVM region, and one or more transistor regions and SRAM regions. To protect the logic transistor regions and SRAM regions from the processing of the NVM region, a select gate polysilicon layer is formed over the entire surface of the semiconductor device and retained over the logic transistor regions. After processing of the NVM cell, the select gate polysilicon layer is removed from the logic transistor regions and the SRAM region. The logic transistors and SRAM cells are formed. Drain/source dopants are implanted in the logic transistors, SRAM cells, and NVM cells concurrently.

The integration method provides better control over logic transistor gate widths, and dopant implants because the trench isolation regions for the logic transistors are protected by the polysilicon layer used to form select gates for the NVM cells. Also, anneal processing steps for the NVM cells are performed before formation of the logic transistors and SRAM cells so that a thermal budget for the logic transistors and SRAM cells is not exceeded.

In one embodiment, there is provided, a method of making a semiconductor device comprising: depositing a first polysilicon layer in a non-volatile memory (NVM) region and a logic region of a substrate; depositing a first coating layer over the first polysilicon layer; patterning the first coating layer and the first polysilicon layer to form a first gate in the NVM region while the first coating layer and the first polysilicon layer remains in the logic region; forming a memory cell including the first gate in the NVM region while the first coating layer and first polysilicon layer remains in the logic region; removing the first coating layer and the first layer of polysilicon in the logic region; depositing a logic gate polysilicon layer in the NVM region and the logic region; patterning the logic gate polysilicon layer to form a second gate in the logic region while the logic gate polysilicon layer is removed from the NVM region; and concurrently implanting source/drain regions of the memory cell and the second gate. The first gate in the NVM region may be characterized as a select gate, and the forming the memory cell may comprise: forming a charge storage layer over the select gate and over the logic region; depositing a second polysilicon layer over the charge storage layer; depositing a second coating layer over the second polysilicon layer; patterning the second coating layer and the second polysilicon layer to form a control gate over a portion of a top and sidewall of the select gate while the second coating layer and the second polysilicon layer is removed from the logic region; and removing the charge storage layer from areas of the NVM region that do not underlie the control gate and from the logic region. The charge storage layer may include one or more nanocrystals for storing charge. The charge storage layer may include an oxide-nitride-oxide (ONO) stacked layer for storing charge. The memory cell may be characterized as a split-gate NVM cell. The substrate may further comprise a high-voltage region, the method may further comprise: depositing the logic gate polysilicon layer in the high-voltage region; patterning the logic gate polysilicon layer to form a third gate in the high-voltage region; and forming a high voltage transistor including the third gate in the high voltage region. The method may further comprise forming an oxide layer in the high-voltage region while the first coating layer and first polysilicon layer remains in the logic region. Both of the first coating layer and the second coating layer may include a nitride material. The method may further comprise forming an SRAM memory cell including the second gate in the logic region.

In another embodiment, there is provided, a method of making a semiconductor device comprising: depositing a first polysilicon layer in a non-volatile memory (NVM) region and a logic region of a substrate; depositing a first protective layer over the first polysilicon layer; selectively etching the first protective layer and the first polysilicon layer to form a first gate in the NVM region while the first protective layer and the first polysilicon layer remains in the logic region; forming a split-gate memory cell including the first gate in the NVM region while the first protective layer and first polysilicon layer remains in the logic region; removing the first protective layer and the first layer of polysilicon in the logic region; depositing a logic gate polysilicon layer in the NVM region and the logic region; selectively etching the logic gate polysilicon layer to form a second gate in the logic region while removing the logic gate polysilicon layer from the NVM region; and concurrently forming source/drain regions of the memory cell and the second gate. The first gate in the NVM region may be characterized as a select gate, the step of forming the split-gate memory cell may comprise: forming a charge storage layer over the select gate and over the logic region; depositing a second polysilicon layer over the charge storage layer; depositing a second coating layer over the second polysilicon layer; selectively etching the second coating layer and the second polysilicon layer to form a control gate over a portion of a top and sidewall of the select gate while the second coating layer and the second polysilicon layer is removed from the logic region; and selectively etching the charge storage layer from areas of the NVM region that do not underlie the control gate and from the logic region. The charge storage layer may include one or more nanocrystals for storing charge or an oxide-nitride-oxide (ONO) stacked layer for storing charge. Forming the split-gate memory cell may further comprise implanting source/drain extensions in the NVM region. Forming source/drain regions may include deep implanting of the source/drain regions. The first protective layer may include a nitride material. The method may further comprise forming an SRAM memory cell including the second gate in the logic region. Selectively etching the logic gate polysilicon layer may further comprise forming a third gate in the logic region, the third gate having a different dielectric thickness than the second gate.

In yet another embodiment, there is provided, a semiconductor device comprising: a non-volatile memory (NVM) cell formed in an NVM region of a semiconductor substrate, the NVM cell having a select gate formed from a first polysilicon layer deposition, a control gate formed from a second polysilicon layer deposition, and a charge storage layer formed between the select gate and the control gate; and a logic transistor formed in a logic region of the semiconductor substrate protected by the first polysilicon layer and the second polysilicon layer during the formation of the NVM cell, the logic transistor formed from a third polysilicon layer deposition after the first and second polysilicon layers are removed. The method may further comprise implanting the source/drain regions of the NVM cell and the logic transistor concurrently. The charge storage layer may include one or more nanocrystals for storing charge or an oxide-nitride-oxide (ONO) stacked layer for storing charge.

FIG. 1 through FIG. 13 illustrate a method for integrating a non-volatile memory cell with various logic transistors on a semiconductor device 20 in accordance with an embodiment.

FIG. 1 illustrates a cross-sectional view of semiconductor device 20 at a stage in processing. Semiconductor device 20 is processed to form an integrated circuit having a non-volatile memory region 22, a high voltage transistor region 24, and a CMOS logic transistor region 26. The regions are isolated from each other using trench isolation (not shown). In other embodiments, other isolation techniques may be used. Semiconductor device 20 can be any semiconductor material or combinations of materials, such as gallium arsenide, silicon germanium, silicon-on-insulator (SOI), silicon, monocrystalline silicon, the like, and combinations of the above.

Figure 2:
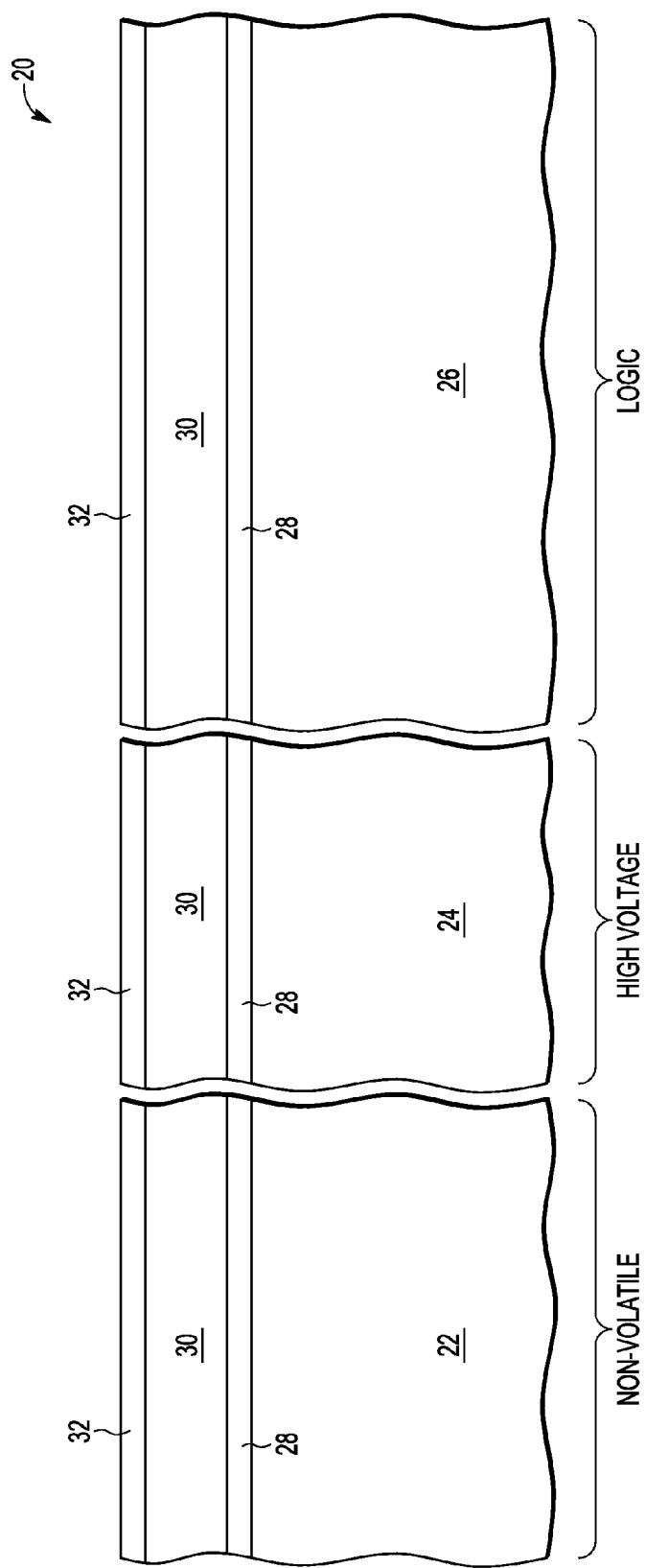

FIG. 2 illustrates semiconductor device 20 after select gate oxide layer 28, polysilicon layer 30, and ARC (anti-reflective coating) layer 32 are formed. After shallow trench isolation and p-well dopants are implanted and annealed, approximately 20 to 60 angstroms of oxide layer 28 is grown on the surface of the semiconductor and is for forming a select gate for NVM memory cells in NVM region 22. In the described embodiment, a plurality of NVM cells is organized as a conventional array having rows and columns of NVM memory cells. The array is made up of split-gate type NVM cells, each having a control gate, charge storage layer comprising nitride or nanocrystals, and a select gate. In other embodiments, a different NVM cell type may be used. For the purposes of simplicity and clarity, only one NVM cell of an NVM array will be illustrated. Polysilicon layer 30 is deposited to a thickness of about 600 to 1500 angstroms on oxide layer 28 over NVM region 22, high voltage transistor region 24, and logic transistor region 26. Polysilicon layer 30 will function as select gates for the array of NVM cells in NVM region 22. ARC layer 32 is deposited on polysilicon layer 30 in NVM region 22, high voltage transistor region 24, and logic transistor region 26. ARC layer 32 comprises a nitride material. In another embodiment, ARC layer 32 may comprise a carbon ARC.

Figure 3:
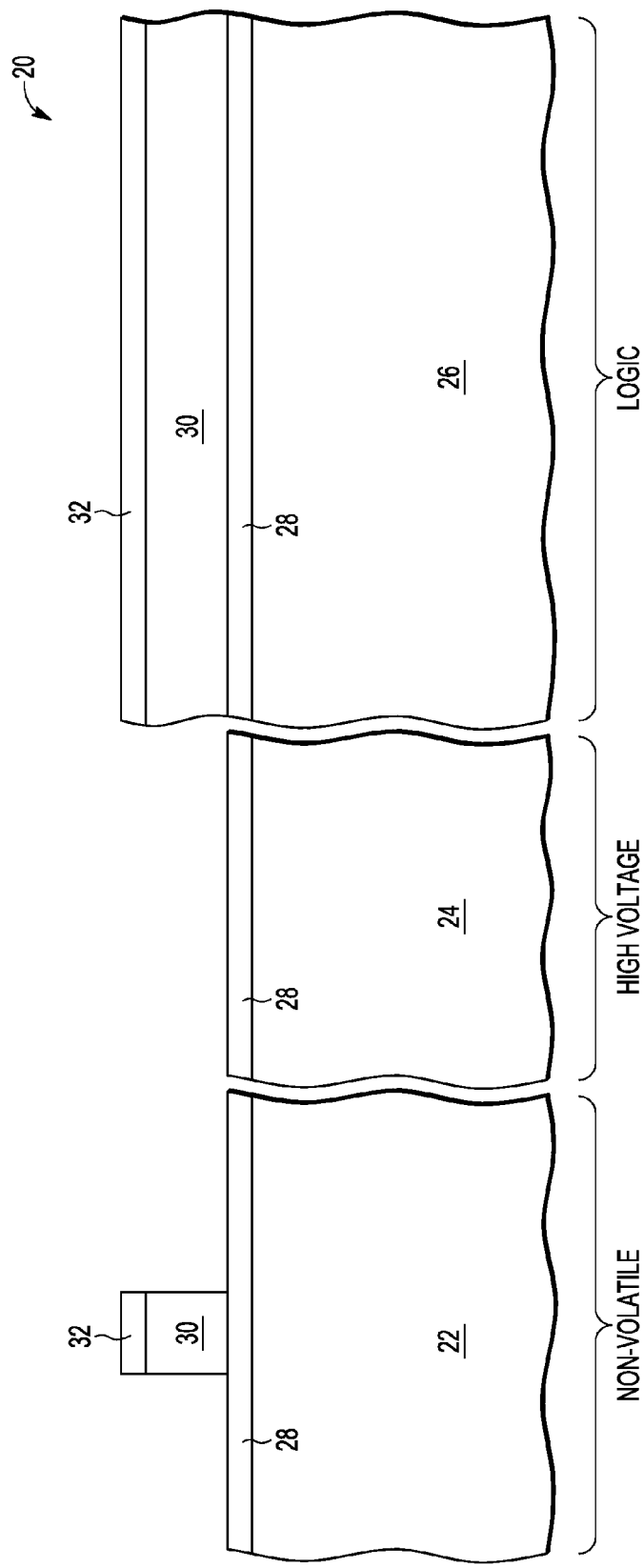

FIG. 3 illustrates semiconductor device 20 after patterning of polysilicon layer 30 to form select gates for the NVM cells in NVM region 22. Some of oxide layer 28 may also be removed. At the same time the select gates are patterned in NVM region 22, polysilicon layer 30 and ARC layer 32 are removed from high voltage transistor region 24. Polysilicon layer 30 and ARC layer 32 are protected with photoresist (not shown) in logic transistor region 26.

Figure 4:
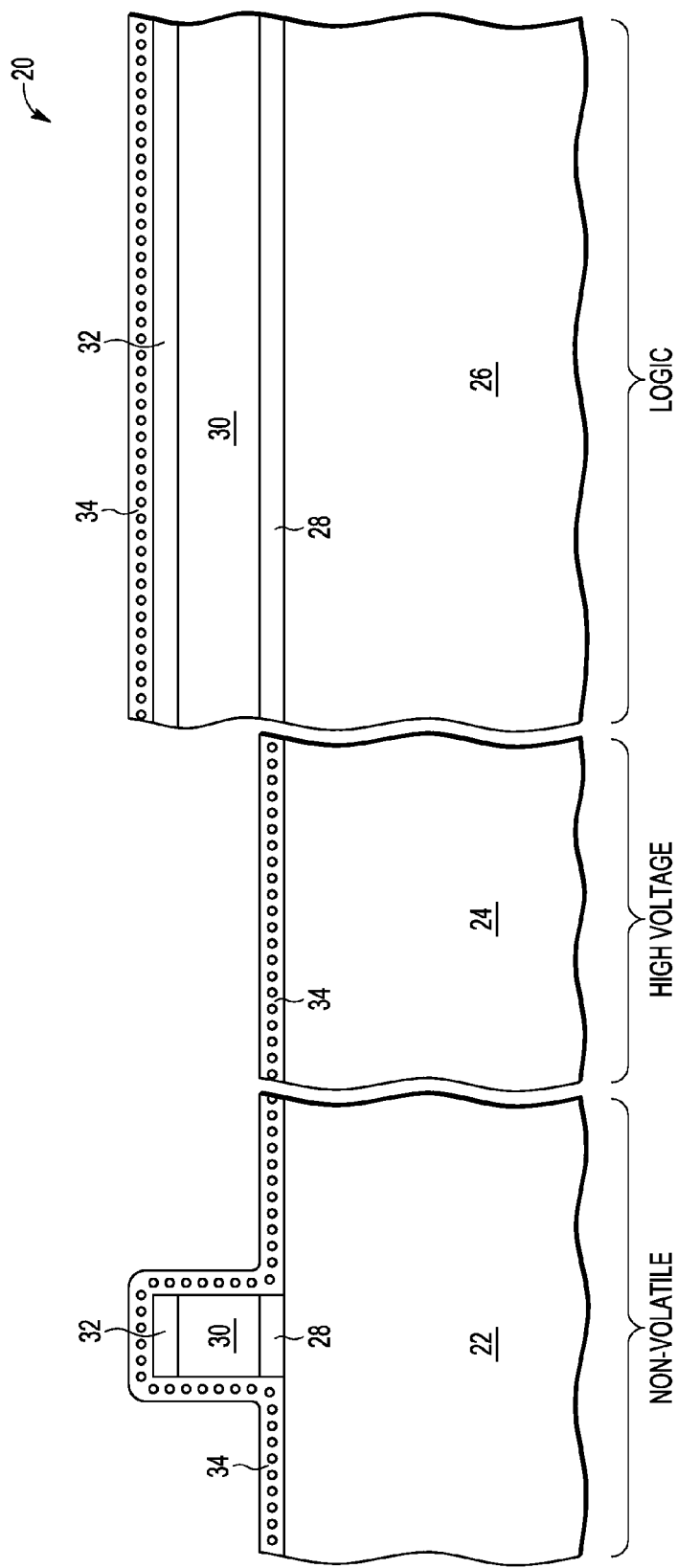

FIG. 4 illustrates semiconductor device 20 after charge storage layer 34 is formed on the surface of NVM region 22, high voltage region 24, and logic region 26. Oxide layer 28 is removed from NVM region 22 and high voltage transistor region 24. If necessary, N-wells and/or P-wells are implanted in high voltage region 24 prior to forming charge storage layer 34. Charge storage layer 34 is a conventional charge storage layer for storing charge in an NVM cell. In the illustrated embodiment, charge storage layer 34 includes a plurality of nanocrystals (represented by circles). The plurality of nanocrystals is isolated by an insulating material such as silicon dioxide. In one embodiment, charge storage layer 34 is formed in multiple layers, where a first, or bottom, dielectric layer is formed and nanocrystals are formed on the first dielectric layer. Note that the first dielectric layer will not grow on ARC layer 32 in logic transistor region 26. The nanocrystals may be formed from polysilicon, germanium, silicide, metal, or other suitable material. In another embodiment, silicon nitride may be used to form charge storage regions in charge storage layer 34 having an oxide-nitride-oxide (ONO) in a stacked structure. After forming the nanocrystals, a second dielectric layer is deposited over the nanocrystals to isolate the nanocrystals from subsequently formed layers. An anneal step follows deposition of the second dielectric layer.

Figure 5:
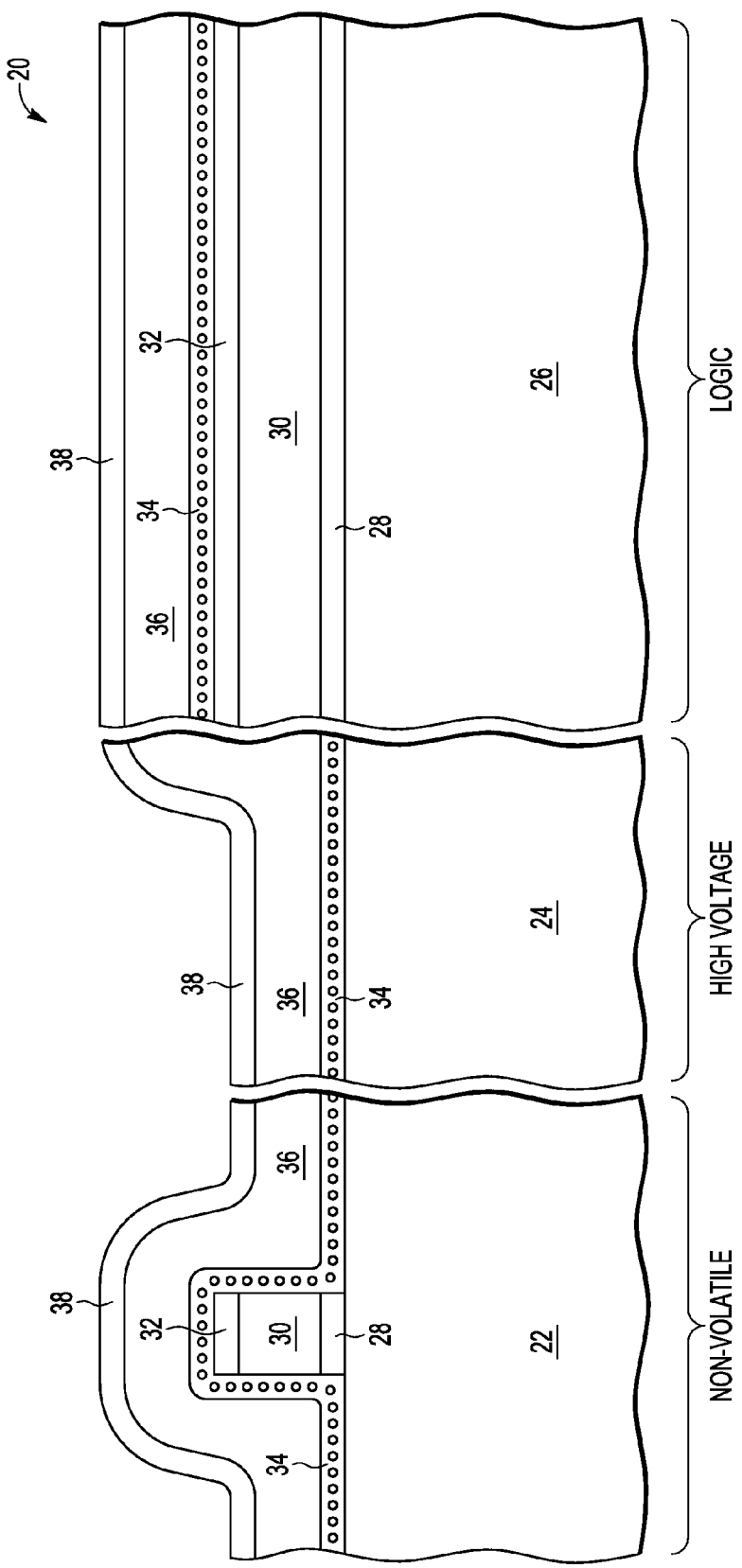

FIG. 5 illustrates semiconductor device 20 after subsequent steps of processing. Polysilicon layer 36 is deposited on NVM region 22, high voltage transistor region 24, and logic transistor region 26. Polysilicon layer 36 will be patterned to form control gates for the NVM cells of NVM region 22. ARC layer 38 comprising nitride is formed on polysilicon layer 36.

Figure 6:
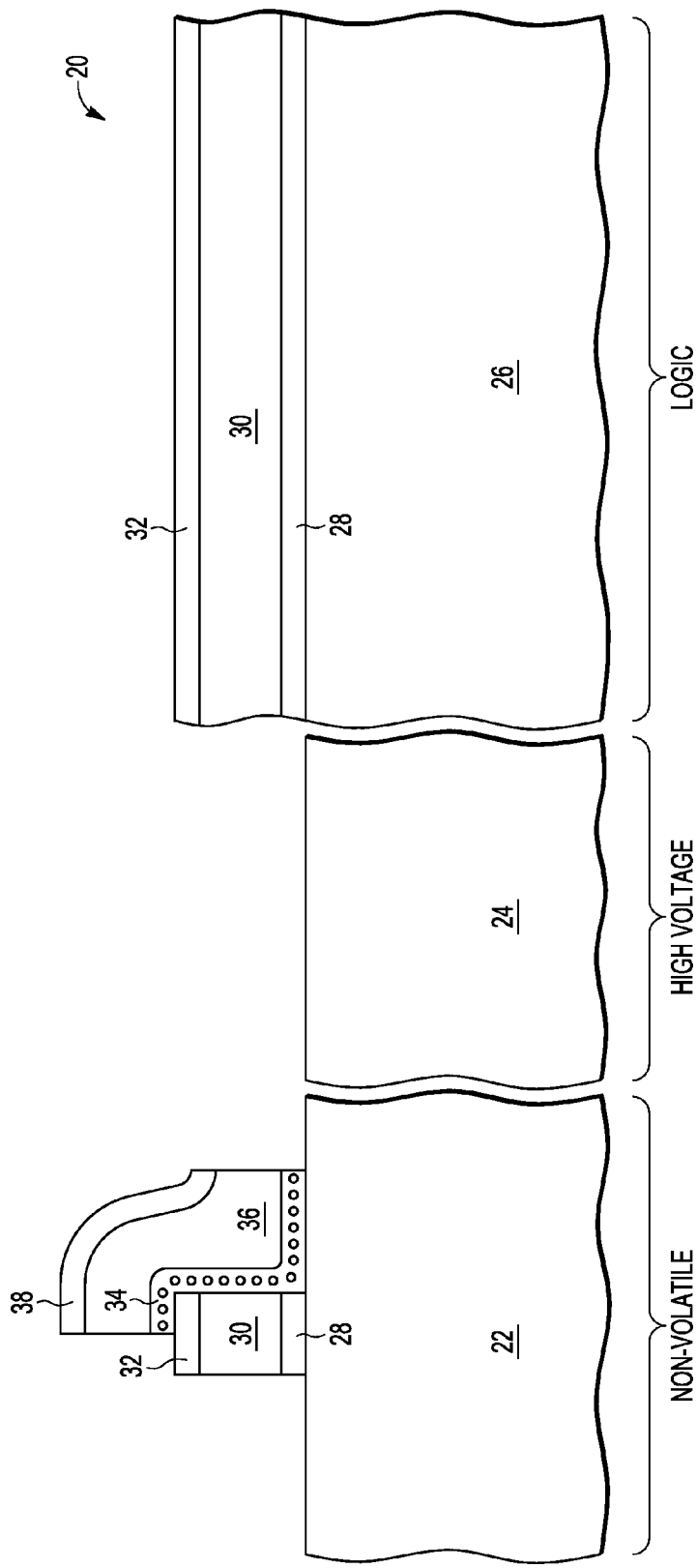

FIG. 6 illustrates semiconductor device 20 after polysilicon layer 36 and ARC layer 38 are patterned to form control gates over a portion of a top and sidewall of select gate 30 of the NVM cells in NVM region 22. ARC layer 32 and polysilicon layer 36 protects logic region 26 from processing while NVM cells are being formed in NVM region 22. At the same time the NVM cells are being formed, polysilicon layer 36 and ARC layer 38 are etched from high voltage transistor region 24 stopping on charge storage layer 34. Then charge storage layer 34 is removed from unprotected areas by etching, leaving silicon exposed in high voltage transistor region 24 and around the NVM cells of NVM region 22. ARC 32 and polysilicon layer 30 continue to protect logic transistor region 26. Charge storage layer 34 continues to underlie control gate 36 of NVM region 22.

Figure 7:
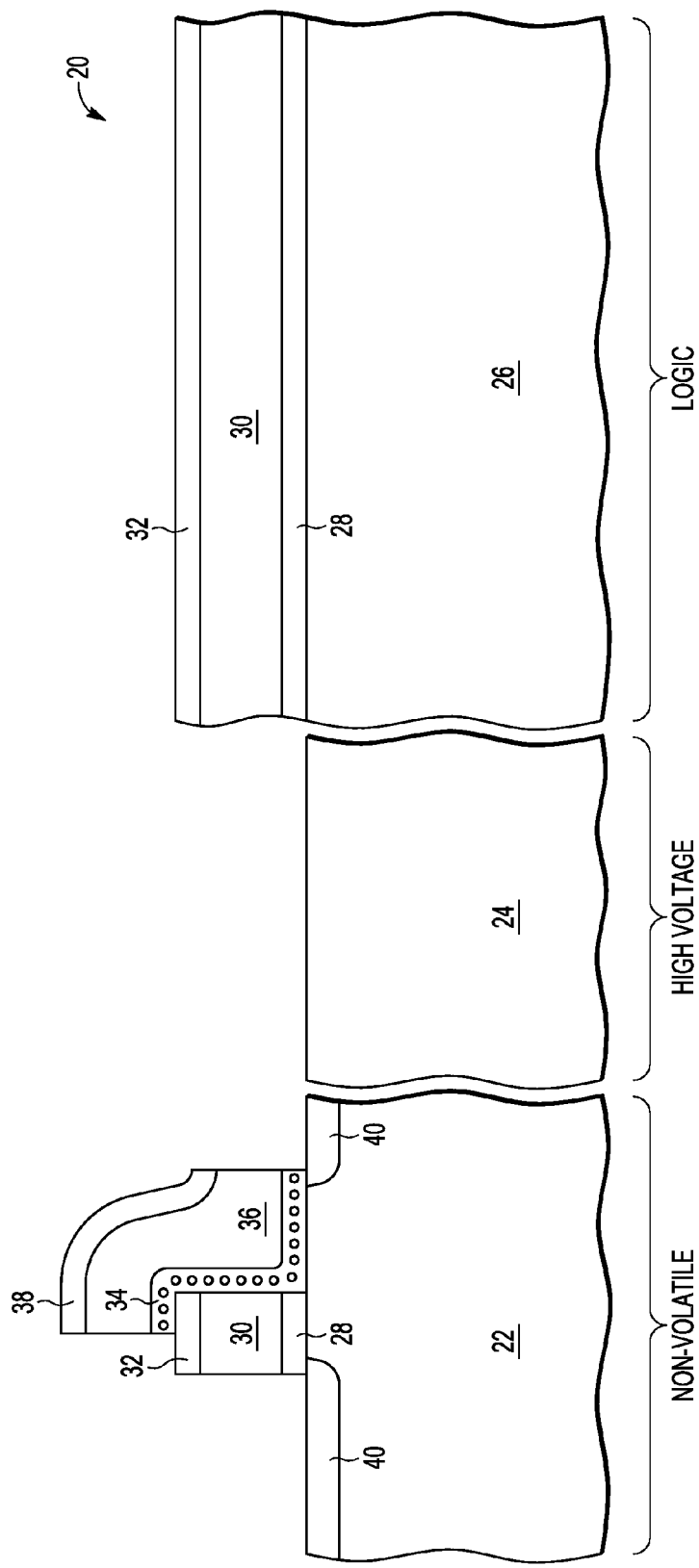

FIG. 7 illustrates semiconductor device 20 after source/drain extensions 40 are implanted into NVM region 22. Note that the illustrated transistors can be either P-channel or N-channel transistors, depending on well types, dopants, etc.

Figure 8:
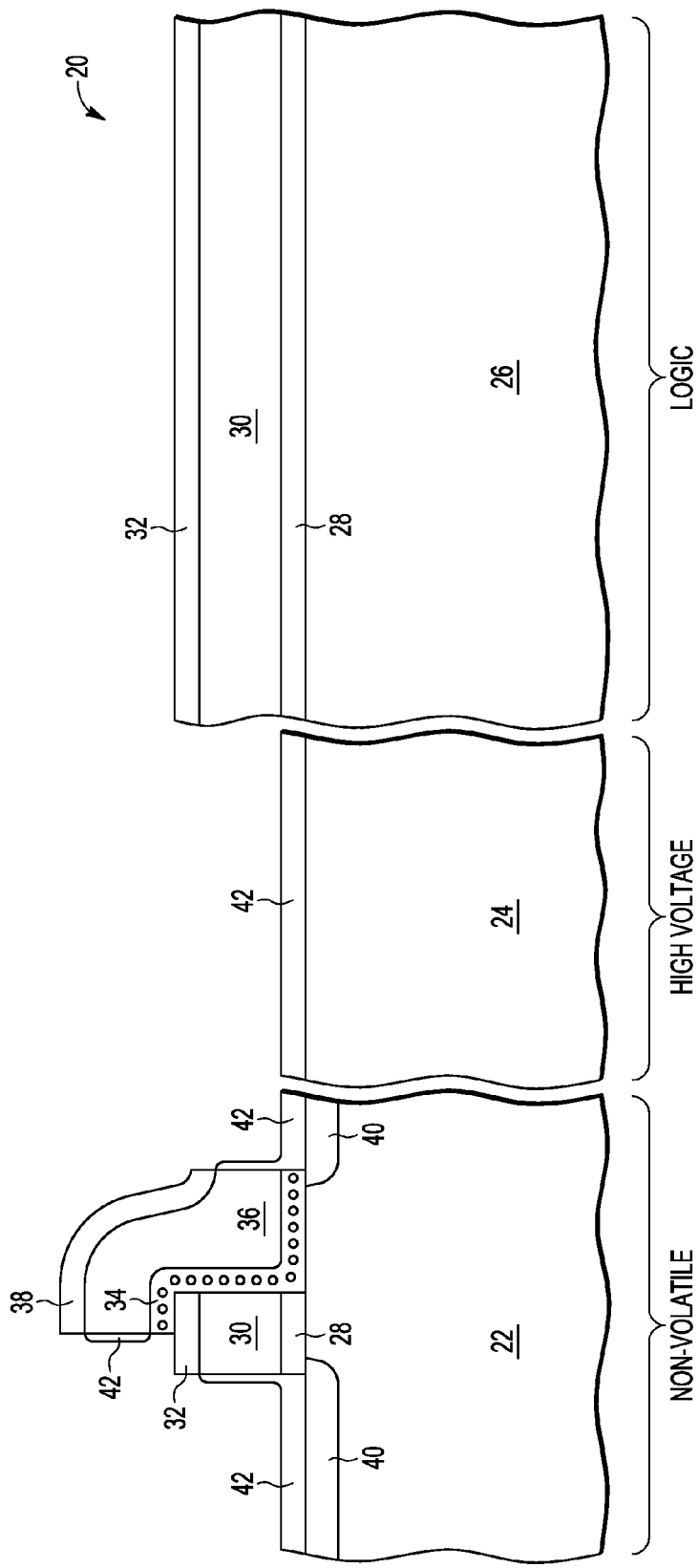

FIG. 8 illustrates semiconductor device 20 after growing high voltage oxide layer 42. Oxide layer 42 is grown over source/drain extensions 40, over the sides of polysilicon layers 30 and 36, and over the exposed silicon of high voltage transistor region 24. Oxide layer 42 is grown thick enough to sustain 5 to 10 volts. Other embodiments may have to sustain higher voltages.

Figure 9:
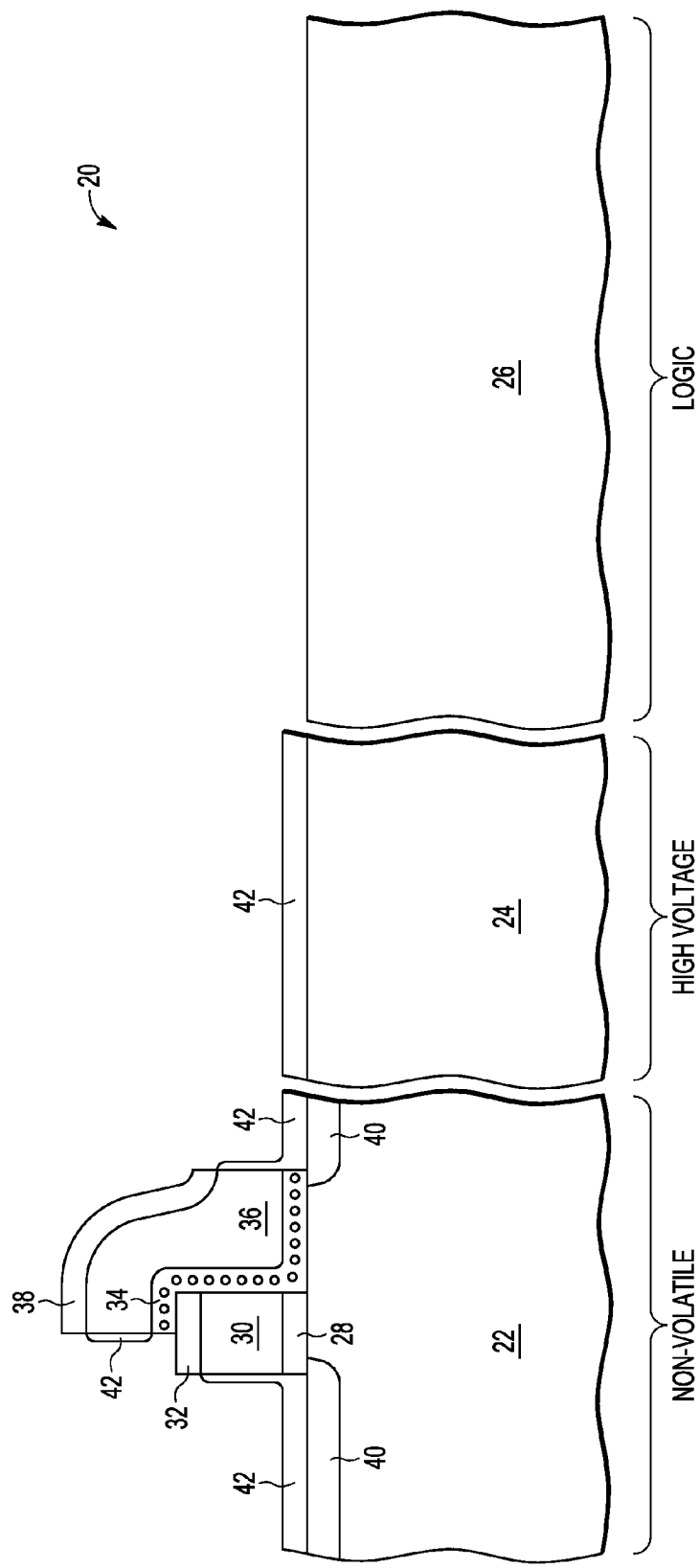

FIG. 9 illustrates semiconductor device 20 after polysilicon layer 30 and ARC layer 32 are removed from logic transistor region 26 by dry etching, stopping on oxide layer 28. Oxide layer 28 is then removed by wet etching. NVM region 22 is protected from being etched by photoresist (not shown). The photoresist is removed after the dry and wet etching steps.

Figure 10:
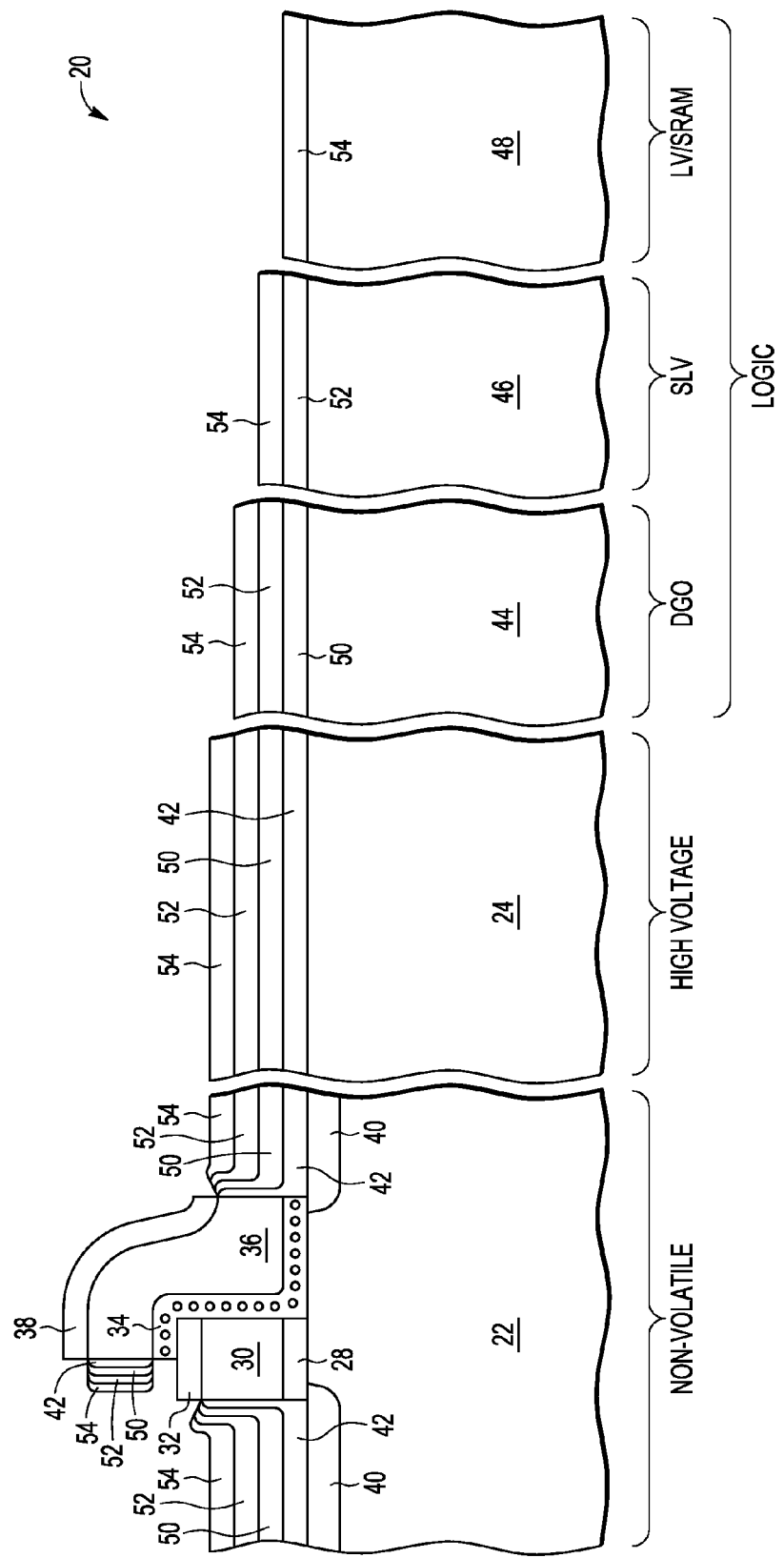

FIG. 10 illustrates semiconductor device 20 after logic transistor region 26 is subdivided into various logic transistor regions. In the illustrated embodiment, logic transistor region includes dual gate oxide (DGO) transistor region 44, supra low voltage (SLV) transistor region 46, and low voltage (LV)/static random access memory (SRAM) transistor region 48. In other embodiments, different logic transistor regions can be formed. Well dopants are then implanted in DGO region 44, SLV region 46, and LV/SRAM region 48. In one embodiment, the same dopants are implanted in all of the regions. The transistors formed in DGO region 44, SLV region 46, and LV/SRAM region 48 are distinguished from each other primarily by their gate oxide thicknesses, where the DGO transistors have the thickest gate oxide, followed by the SLV transistors and then the LV transistors. The gate oxide thickness is a factor in the determination of transistor threshold voltages. The LV transistors have the lowest threshold voltage, and the DGO transistors have the highest threshold voltage. Note that LV transistors are used to form conventional six-transistor SRAM cells. The SLV transistors have a threshold voltage higher than the threshold voltage of the LV transistors, but lower than the threshold voltage of the DGO transistors.

Two masking steps are used to form the various gate dielectric thicknesses for the logic region transistors. Oxide layer 50 is first formed and functions as part of the gate dielectric for high voltage transistor region 24 and DGO transistor region 44. Oxide 50 is removed by etching in SLV transistor region 46 with a first mask. Then oxide layer 52 is formed. Oxide layers 50 and 52 are removed from LV/SRAM region 48 by etching with a second mask. Oxide layer 54 is grown over all of the transistor regions.

Figure 11:
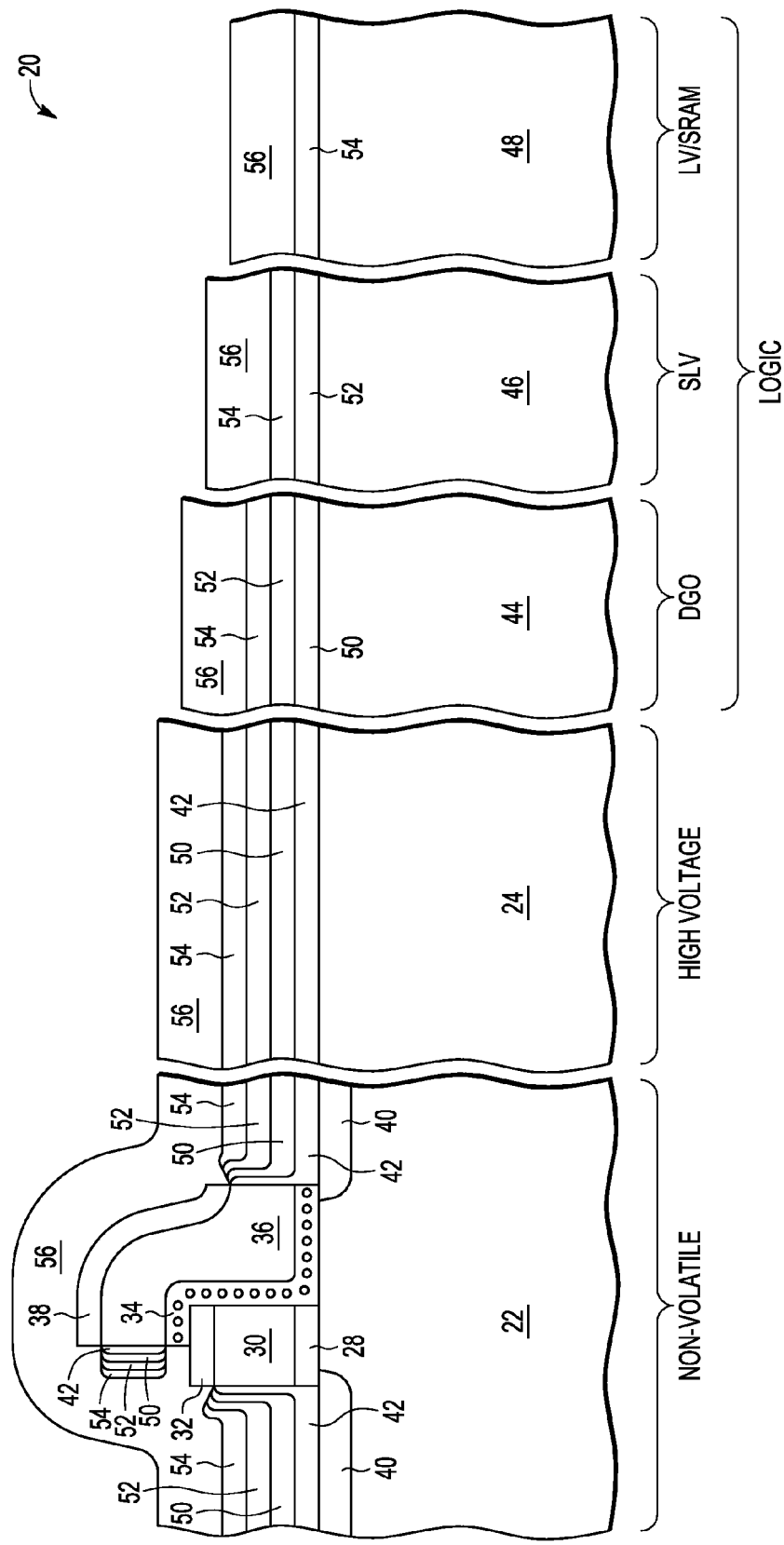

FIG. 11 illustrates semiconductor device 20 after polysilicon layer 56 is formed. Polysilicon layer 56 is deposited over semiconductor device 20 for use as gate electrodes in logic region 26 and high voltage region 24.

Figure 12:
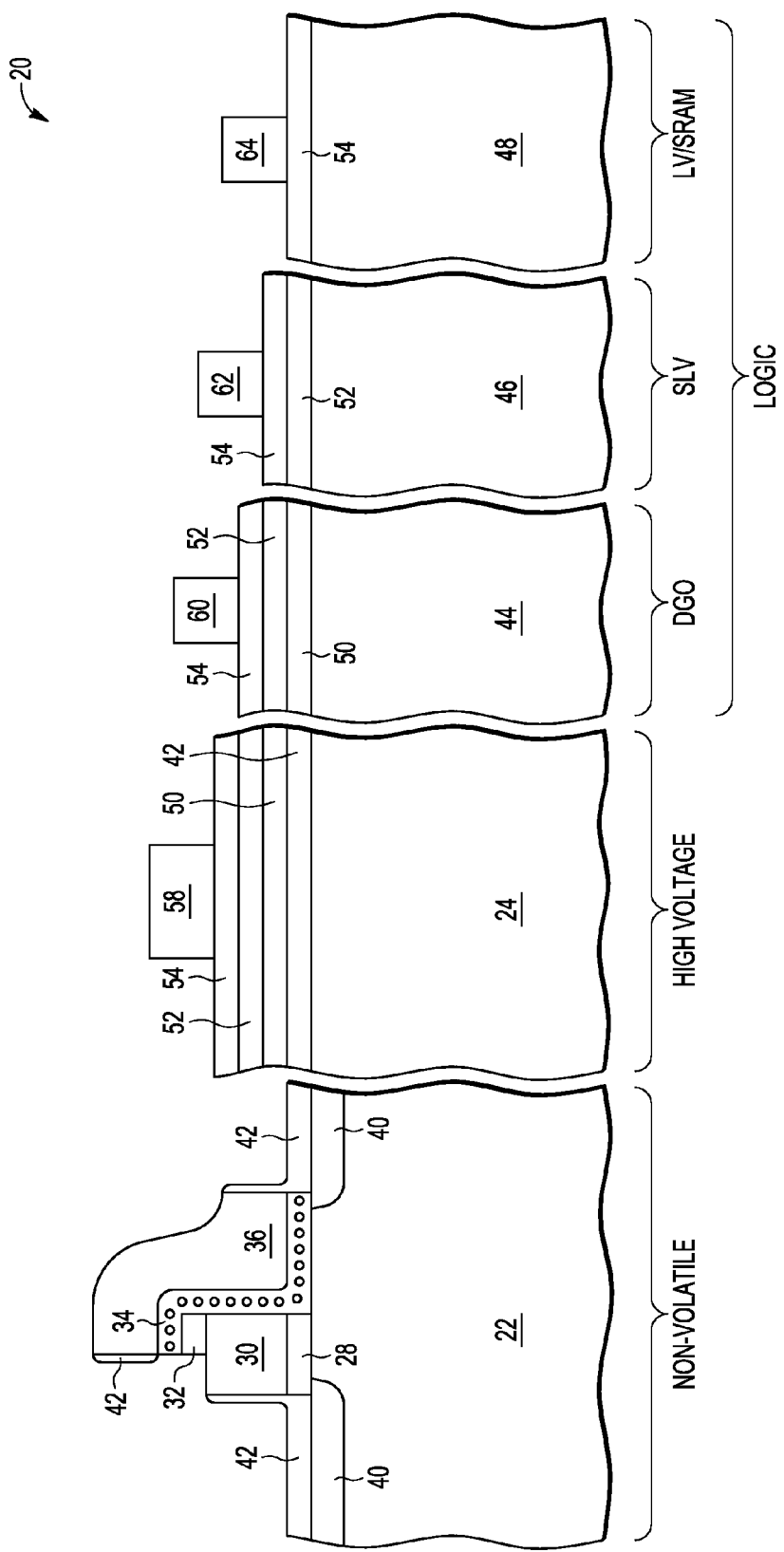

FIG. 12 illustrates semiconductor device 20 after polysilicon layer 56 is patterned and etched to form gate electrodes 58 for the high voltage transistors, gate electrodes 60 for the DGO logic transistors, gate electrodes 62 for the SLV logic transistors, and gate electrodes 64 for the LV logic transistors. Polysilicon layer 56 is removed from NVM region 22 at the same time. Note that due to the topology of the NVM cells, multiple etching steps may be required to remove polysilicon layer 56 from NVM region 22. In the logic region 26, each of the logic transistors has a different gate dielectric thickness. For example, gate electrode 62 is over dielectric layers 52 and 54 while gate electrode of 64 is over only dielectric layer 54. Also, the gate dielectric for gate electrode 60 is over dielectric layers 50, 52, and 54.

Figure 13:
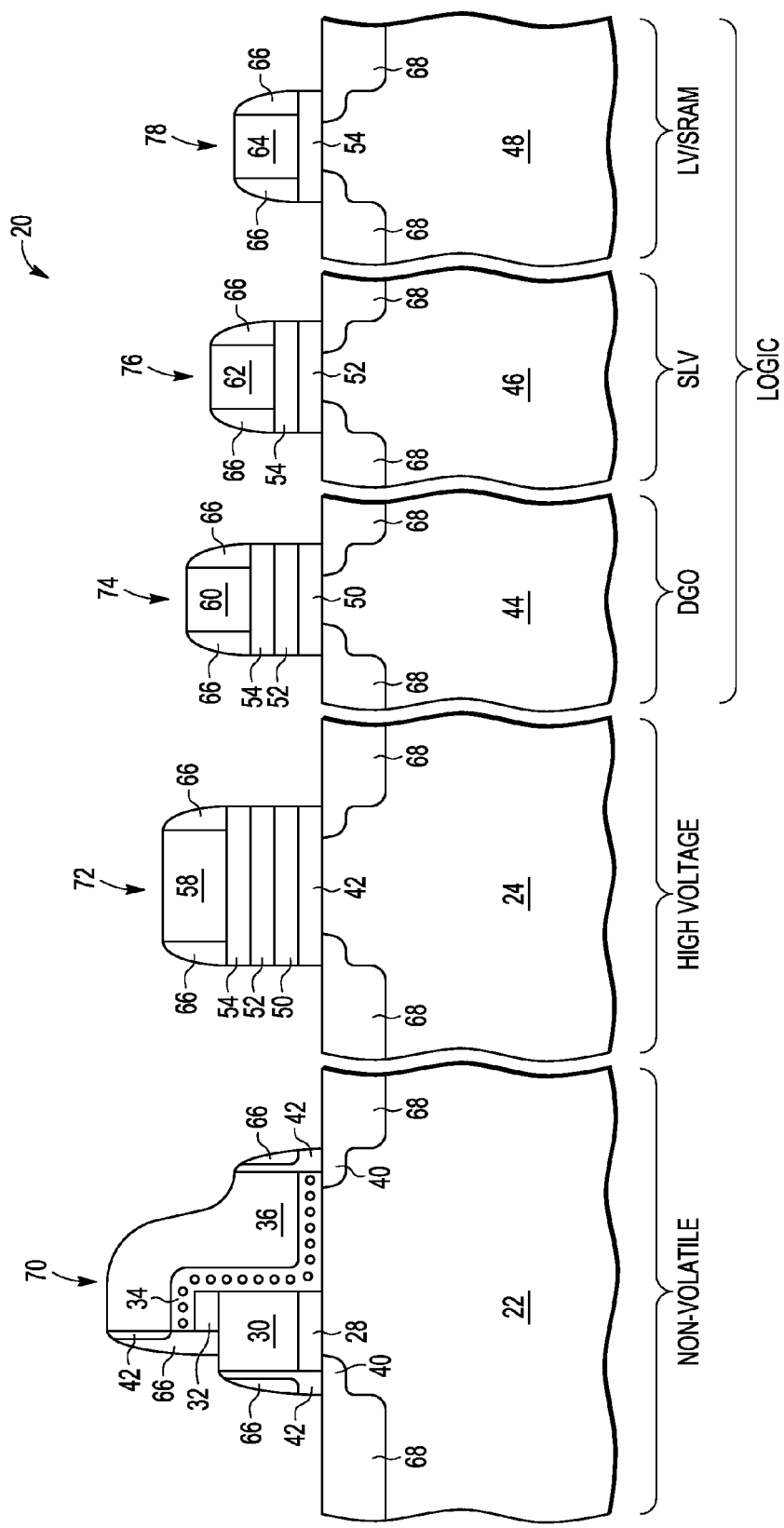

FIG. 13 illustrates semiconductor device 20 after oxide layers 42, 50, 52, and 54 are removed from around the logic transistor gate electrodes. Remaining exposed portions of ARC 32 and 38 are removed. Also, additional processing is used to form side wall spacers 66 and to implant source/drain regions 68 for each of the transistor types. The source/drain regions 68 are concurrently implanted for each transistor type at the same time. NVM transistors 70, high voltage transistors 72, DGO transistors 74, SLV transistors 76, and LV transistors 78 are thus formed. Note that the above described processing steps can be in a different order in other embodiments.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of making a semiconductor device, the method comprising:
    depositing a first polysilicon layer in a non-volatile memory (NVM) region and a logic region of a substrate;
    depositing a first anti-reflective coating (ARC) layer over the first polysilicon layer;
    patterning the first ARC layer and the first polysilicon layer to form a first gate in the NVM region while the first ARC layer and the first polysilicon layer remains in the logic region;
    forming a memory cell including the first gate in the NVM region while the first ARC layer and first polysilicon layer remains in the logic region;
    removing the first ARC layer and the first layer of polysilicon in the logic region;
    implanting source/drain extension regions of the memory cell before depositing a logic gate polysilicon layer in the NVM region and the logic region;
    patterning the logic gate polysilicon layer to form a second gate in the logic region while the logic gate polysilicon layer is removed from the NVM region; and
    concurrently implanting source/drain regions of the memory cell and the second gate.

2. The method of claim 1, wherein the first gate in the NVM region is characterized as a select gate, the forming the memory cell comprising:
    forming a charge storage layer over the select gate and over the logic region;
    depositing a second polysilicon layer over the charge storage layer;
    depositing a second ARC layer over the second polysilicon layer;
    patterning the second ARC layer and the second polysilicon layer to form a control gate over a portion of a top and sidewall of the select gate while the second ARC layer and the second polysilicon layer is removed from the logic region; and
    removing the charge storage layer from areas of the NVM region that do not underlie the control gate and from the logic region.

3. The method of claim 2, wherein the charge storage layer includes one or more nanocrystals for storing charge.

4. The method of claim 2, wherein the charge storage layer includes an oxide-nitride-oxide (ONO) stacked layer for storing charge.

5. The method of claim 2, wherein the memory cell is characterized as a split-gate NVM cell.

6. The method of claim 1, wherein the substrate further comprises a high-voltage region, the method further comprising:
    depositing the logic gate polysilicon layer in the high-voltage region;
    patterning the logic gate polysilicon layer to form a third gate in the high-voltage region; and
    forming a high voltage transistor including the third gate in the high voltage region.

7. The method of claim 6, further comprising forming an oxide layer in the high-voltage region while the first ARC layer and first polysilicon layer remains in the logic region.

8. The method of claim 1, wherein both of the first ARC layer and the second ARC layer includes a nitride material.

9. The method of claim 1, further comprising forming an SRAM memory cell including the second gate in the logic region.

10. A method of making a semiconductor device, the method comprising:
    depositing a first polysilicon layer in a non-volatile memory (NVM) region and a logic region of a substrate;
    depositing a first anti-reflective coating (ARC) layer over the first polysilicon layer;
    selectively etching the first ARC layer and the first polysilicon layer to form a first gate in the NVM region while the first ARC layer and the first polysilicon layer remains in the logic region;
    forming a split-gate memory cell including the first gate in the NVM region while the first ARC layer and first polysilicon layer remains in the logic region;
    removing the first ARC layer and the first layer of polysilicon in the logic region;
    implanting source/drain extensions in the NVM region before depositing a logic gate polysilicon layer in the NVM region and the logic region;
    selectively etching the logic gate polysilicon layer to form a second gate in the logic region while removing the logic gate polysilicon layer from the NVM region; and
    concurrently forming source/drain regions of the memory cell and the second gate.

11. The method of claim 10, wherein the first gate in the NVM region is characterized as a select gate, the forming the split-gate memory cell comprising:
    forming a charge storage layer over the select gate and over the logic region;
    depositing a second polysilicon layer over the charge storage layer;
    depositing a second ARC layer over the second polysilicon layer;
    selectively etching the second ARC layer and the second polysilicon layer to form a control gate over a portion of a top and sidewall of the select gate while the second ARC layer and the second polysilicon layer is removed from the logic region; and
    selectively etching the charge storage layer from areas of the NVM region that do not underlie the control gate and from the logic region.

12. The method of claim 11, wherein the charge storage layer includes one or more nanocrystals for storing charge or an oxide-nitride-oxide (ONO) stacked layer for storing charge.

13. The method of claim 11, wherein implanting source/drain extensions in the NVM region further comprises implanting source/drain extensions in the NVM region before selectively etching the second ARC layer.

14. The method of claim 10, wherein forming source/drain regions includes deep implanting of the source/drain regions.

15. The method of claim 10, wherein the first ARC layer includes a nitride material.

16. The method of claim 10, further comprising forming an SRAM memory cell including the second gate in the logic region.

17. The method of claim 10, wherein selectively etching the logic gate polysilicon layer further comprises forming a third gate in the logic region, the third gate having a different dielectric thickness than the second gate.

* * * * *